Feb. 7, 1956 JACQUES I. PANTCHECHNIKOFF NOW BY CHANGE OF NAME JACQUES ISAAC PANKOVE 2,734,102

SEMICONDUCTOR DEVICES

Filed March 31, 1949

INVENTOR

JACQUES I. PANTCHECHNIKOFF

BY H. L. Newton

ATTORNEY

United States Patent Office 2,734,102

Patented Feb. 7, 1956

2,734,102

SEMICONDUCTOR DEVICES

Jacques I. Pantchechnikoff, now by change of name Jacques Isaac Pankove, Princeton, N. J., assignor to Radio Corporation of America, a corporation of Delaware Application March 31, 1949, Serial No. 84,672

11 Claims. (Cl. 179—171)

This invention relates to semi-conductor devices and particularly to novel multi-electrode semi-conductors suitable for high gain amplifiers, oscillators, or the like.

The three-electrode semi-conductor is a recent development in the field of electronic amplification. This device is presently known as a "transistor," and its essential characteristics have been disclosed in a series of three letters to the Physical Review by Bardeen and Brattain, Brattain and Bardeen, and Shockley and Pearson which appear on pages 230 to 233 of the July 15, 1948 issue. The new amplifier device includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conductor. The input circuit of the amplifier described in the publication referred to above is connected between the emitter electrode and the base electrode while the output circuit is connected between the collector electrode and the base electrode. In this circuit the base electrode is the common input and output electrode and may, therefore, be grounded.

Due to several facts a semi-conductor amplifier of the type described in the publication referred to above has a limited power output. It appears that the electric lines of force between two point contacts are not parallel to each other so that the charge carriers travel over different paths between the point contacts. Furthermore, due to the geometrical arrangement of the electrodes, only a small portion of the charge carriers emitted by one of the point electrodes is collected by the other point electrode. Obviously, the emitted charge carriers will normally move along radial paths away from the emitter point electrode so that most of them will not reach a collector point electrode provided in the vicinity of the emitter electrode. Furthermore, the mechanical stability of point electrodes provided on a semi-conductor crystal is not as good as desired because the electrodes may slip along the surface of the crystal. For a satisfactory operation of a semi-conductor amplifier or oscillator it is essential that the distance between the two point electrodes be maintained exactly at the desired value.

It is accordingly the principal object of the present invention to provide a novel multi-electrode semi-conductor device where the effective contact area of the emitter and collector electrodes is increased but is still small compared to that of the base electrode, thereby to provide for a larger amplification factor and a higher power output of the device without materially increasing the current density at the contact area of the emitter and collector electrodes.

A further object of the invention is to provide an improved semi-conductor device having lower input and output impedances than prior devices, and having good mechanical stability with respect to the small-area electrodes.

Another object of the invention is to provide a multi-electrode semi-conductor device where the small-area electrodes are arranged so that the equipotential lines between the electrodes are substantially parallel to each other whereby the charge carriers may travel from one electrode to the other along paths of equal length.

A semi-conductor device, in accordance with the present invention, comprises a body of semi-conducting material which, preferably is provided with a substantially flat face. The flat surface may be provided by lapping a surface of the crystal and thereafter etching it, for example, in a conventional manner. The body of semi-conducting material is then provided with a first electrode which may form the base electrode and which has a relatively large contact area with the semi-conducting body. At least two further electrodes are provided, each of which forms substantially a line contact with the semi-conducting body, the contacting areas thereof being small compared to the contact area of the first or base electrode. The electrodes which form the line contacts preferably consist of metallic wires or elongated conductors which are pressed against the flat face of the semi-conducting body to provide an intimate contact between each wire and the semi-conducting body.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
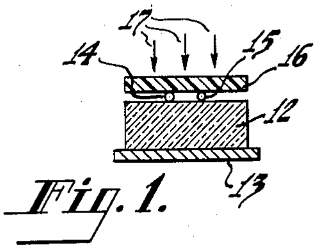
Figure 1 is a sectional view of a three-electrode semi-conductor embodying the present invention.
Figure 2:
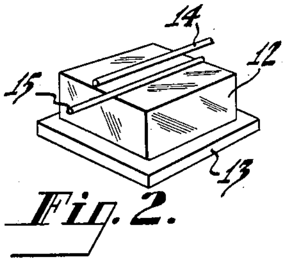
Figure 2 is a view in perspective of a semi-conducting crystal provided with a large-area electrode and two small-area electrodes, each forming a line contact with the crystal in accordance with the invention.

Referring now to the drawing, in which like components have been designated by the same reference numerals throughout the figures, and particularly to Figures 1 and 2, there is illustrated a semi-conductor device embodying the present invention which may be used as an amplifier, oscillator or the like. The device comprises a body or block 12 of semi-conducting material which may consist, for example, of a semi-conducting element such as germanium, silicon, boron, tellurium or selenium containing a small but sufficient number of atomic impurity centers or lattice imperfections as commonly employed for best results in semi-conductor devices such as crystal rectifiers. Germanium is the preferred material for body 12 and may be prepared so as to be an electronic N type semi-conductors as will be explained hereinafter. The surface of semi-conducting body 12 may be polished and etched in the manner explained in the paper by Bardeen and Brattain referred to. It is also feasible to utilize the germanium block from a commercial high-back-voltage germanium rectifier such as the type 1N34 in which case further surface treatment may not be required. Preferably, however, the surface of the crystal 12 is lapped to obtain a substantially flat face and is then etched in the usual manner.

Semi-conductor block 12 may be provided with three or more electrodes. Electrode 13 is the base electrode and provides a large-area, low-resistance contact with the bulk material of semi-conductor body 12. Two further electrodes 14 and 15 form small-area contacts with semi-conductor body 12. In accordance with the present invention electrodes 14 and 15 form each substantially a line contact with semi-conductor body 12. One of the electrodes such as electrode 14 may be the emitter electrodes while the other electrode 15 may be the collector electrode of a three-electrode semi-conductor amplifier or oscillator. Electrodes 14 and 15 consist each of a suitable elongated conductor such as a wire which may be made of tungsten, nickel or copper beryllium. As presently used, the wires of which electrodes 14 and 15 consist may have a diameter between one half and one mil. Likewise, the two wires which form the line contact electrodes 14 and 15 have a distance between their centers of between 1 and 4 mils. As at present preferred, the wires of which electrodes 14 and 15 consist have a diameter of one mil and their centers are spaced apart two mils so that the distance between the line contacts is two mils and the distance between the wires amounts to one mil.

In accordance with the present invention the line contact electrodes 14 and 15 are mechanically pressed against the flat face of semi-conductor body 12. This may be effected as illustrated schematically in Figure 1 by pressing a block 16 of insulating material against wires 14, 15 as indicated by arrows 17. This mechanical pressure will insure an intimate contact between wires 14, 15 and the flat face of semi-conductor body 12. Wires 14, 15 should consist of a metal which is softer than the semi-conducting material. On the other hand, the metal should not be too soft so that the wires will not flatten under the application of pressure. Tungsten is a preferred material for wires 14, 15. From the experimental evidence at hand it is believed that contact is made between wires 14, 15 and semi-conductor body 12 by a large number of individual point contacts, and it is estimated that the largest distance between two contact points is of the order of .2 mil. In other words, the distance between two individual contact points of a line contact is small compared to the distance between the two line contacts.

At the present time it is not possible to give a definite theory accounting for all details of the operation of the three-electrode, semi-conductor amplifier. It is believed, however, that the following explanation will be helpful for a better understanding of the present invention. A semi-conductor is a material whose electrical conductivity lies intermediate the conductivity of good conductors and that of good insulators. The materials which have been widely used in crystal rectifiers and which are also used in the three-electrode, semi-conductor amplifier are of crystalline type, preferably consisting of an aggregate of small crystals. Although conduction in some materials may be ionic in nature, where the actual motion of electrically charged atoms represents the flow of current, the present invention is of patricular value in connection with those materials in which the atoms remain relatively fixed while conduction takes place by electrons. These latter materials are called electronic semi-conductors. It is appreciated that ionic conductors can also be of use in amplifier devices so that, although the discussion and explanation of operation is confined to electronic semi-conduction of the type found for example in silicon or germanium, the invention is not to be construed as so limited, except as defined in the appended claims.

For some time it has been assumed that there are two types of electronic semi-conductors, one called the N type (negative type) while the other is called the P type (positive type). The N type semi-conductor behaves as if there were present a limited number of free negative charges or electrons which conduct the current somewhat similarly to the manner in which current conduction takes place in a metal. Such material, in a well-ordered crystal lattice, would not be expected to have many free electrons. It is therefore assumed that the free electrons which account for the conduction are donated by impurities or lattice imperfections which may be termed "donors." Thus, in an N type silicon crystal which is a semi-conductor, the donor may consist of small impurities of phosphorus. Since silicon has four valence electrons and phosphorus five, the excess valence electron of the occasional phosphorus atom is not required for the tetrahedral binding to adjacent silicon atoms in the crystal and hence is free to move. The current in an N type semi-conductor accordingly flows as if carried by negative charges (electrons).

In the P type of semi-conductor, current conduction appears to take place as if the carriers were positive charges. This is believed to be due to the presence of impurities which will accept an electron from an atom of the semi-conductor. Thus, a P type silicon crystal may contain a few boron atoms which act as "acceptors." Since boron has only three valence electrons, it will accept an electron from a silicon atom to complete the atomic bond. There is, accordingly, a "hole" in the crystalline structure which might be considered a virtual positive charge. Under the influence of an external electrical field the hole or the holes will travel in the direction that a positive charge would travel.

If two contacts are made to an electronic semi-conductor of N or P type, and if these contacts are of similar material and of equal area, an impressed voltage will lead to current flow of about the same magnitude with either polarity of voltage. However, it will ordinarily be found that there is a non-linear relation between current and voltage, as the latter is increased.

In the actual two-electrode rectifier (crystal diode), one contact is made to the bulk crystal and is of such large area that its resistance is extremely low for either direction of current flow. Thus, non-linear effects at this large-area contact are not of great significance compared with those at the second contact, which is of very small area (such as that of a wire having a sharp point). In this way, the hypothetical barrier layer at the crystal surface near the small-area contact can cause actual rectification. As already indicated, such an unequal contact area device made of an N type semi-conductor will conduct readily when the small area contact is positive in polarity and is relatively non-conducting when the small area contact is negative. For a two-electrode rectifier made of a P type material the situation is reversed.

In the semi-conductor amplifier of three-electrodes, one large-area contact is made to the bulk crystal and two smaller-area contacts are made close to one another on a crystal surface. There are now two possible barrier layers. This barrier-layer effect will be discussed below in connection with N type material but it is to be understood that analogous effects may occur with P type material by appropriate reversal of potentials just as in the rectifier case.

The recently discovered amplifying properties of the three-electrode semi-conductor may be explained as follows: Let it be assumed that the germanium or silicon crystal used in the device is an N type semi-conductor throughout its bulk. However, it is now believed that a thin surface layer of the crystal, closely related to the so-called barrier-layer effect mentioned above, may behave like a P type semi-conductor. This layer of P type, that is, "hole" conduction, may be caused by a chemical or physical difference in the behavior of the impurities on the surface of the crystal, or it may be caused by a change in the energy levels of the surface atoms due to the discontinuity of the crystal structure at the surface. In any case, an excess of holes is created in this surface layer of the semi-conductor. For the three-electrode semi-conductor amplifier, under discussion, this new theory is very important since the amplifier behavior is chiefly governed by the "hole" current on the surface of the crystal between the two point contacts.

Because the emitter electrode 14 is normally biased positive with respect to the crystal 12, conduction readily takes place through the barrier layer to base electrode 13, with "holes" or virtual positive charges moving in the surface layer of the crystal while electrons carry the current in the interior of the crystal. However, since a nearby collector electrode 15 at a negative potential will cause an electric surface field and attract the positive "holes," the "holes" will not only flow into or through the crystal barrier layer but may also flow directly from emitter electrode 14 to collector electrode 15 along the surface. The collector electrode barrier layer would normally prevent current unless these "holes" are provided by the emitter. Changing the voltage between emitter electrode 14 and the bulk crystal 12 will increase or decrease the emitter current available for flow in the P type surface layer to the collector electrode 15.

Figure 3:
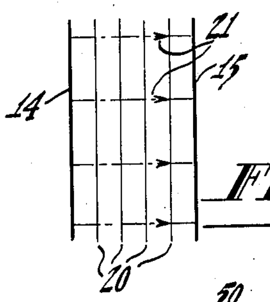
Figure 3 is a diagram illustrating the equipotential lines between the line contacts of the crystal of Figure 2.

It will accordingly be seen that charge or current carriers flow between electrodes 14 and 15. These charge carriers are holes if an N type semi-conductor 12 having a P type surface layer is assumed. Inspection of Figure 3 will reveal that the semi-conductor device of Figures 1 and 2 provides for a more efficient collection of the charge carriers. Electrodes 14 and 15 have been shown schematically in Figure 3 as well as the equipotential lines 20. The charge carriers which may be holes, are indicated by arrows 21, and it will be seen that they travel substantially parallel to each other along paths of equal length. Substantially one half of the charge carriers emitted by electrode 14 will be collected by collector electrode 15, while the other half of the charge carriers will travel in the opposite direction and is therefore lost. In view of the larger area of a line contact electrode as compared to a point contact electrode, the input and output impedances of the electrodes are considerably reduced. Furthermore, the geometrical arrangement of the electrodes permits a larger power output without substantially increasing the current density.

If the semi-conductor device of Figures 1 and 2 is utilized as an amplifier of the type disclosed in the paper by Bardeen and Brattain above referred to, the input impedance of the emitter electrode 14 amounts to 80 ohms and the output impedance of collector electrode 15 amounts to 1,000 ohms. The emitter current is 4 milliamperes (ma.) and the collector current 10 ma. The collector voltage is —15 volts with respect to the grounded base electrode and the emitter voltage is approximately zero. Under these conditions the maximum gain which may be obtained without appreciable distortion has been measured and is given in the table below:

| Input power: | Power amplification |
|---|---|
| 2 microwatts ______ db ___ | 30 |
| 20 microwatts ______ db ___ | 22 |
| 200 microwatts ______ db ___ | 18.5 |
| 2 milliwatts ______ db ___ | 12.5 |
| 20 milliwatts ______ db ___ | 8 |

For an input power of 20 milliwatts the maximum power output without appreciable distortion amounts to 130 milliwatts. It will therefore be seen that the semi-conductor device of the present invention has an appreciably higher power amplification and a higher power output than previously known devices.

Figures 4, 5, 6, 7, 8, 9, 10, 11:
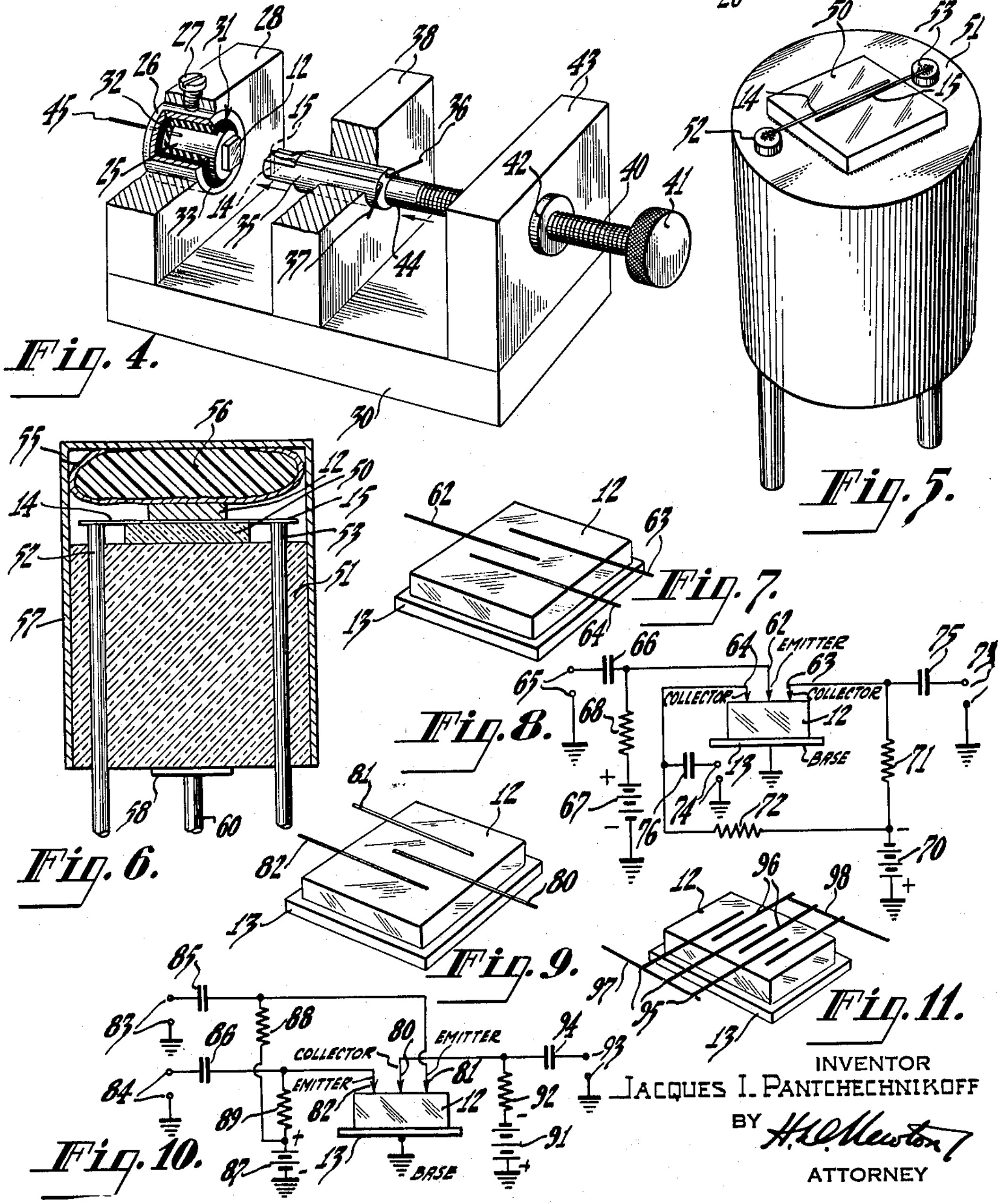
Figure 4 is a view in perspective of a construction of a semi-conductor device in accordance with the invention.
Figure 5 is a view in perspective of the two wires forming the small-area electrodes and their support.
Figure 6 is a sectional view of a preferred embodiment of a semi-conductor device embodying the invention and including the support of Figure 5.
Figure 7 is a view in perspective illustrating schematically a crystal provided with three small-area electrodes.
Figure 8 is a circuit diagram of a twin amplifier utilizing the device of Figure 7.
Figure 9 is a view in perspective similar to Figure 7 illustrating schematically a crystal provided with three small-area electrodes.
Figure 10 is a circuit diagram of a mixer amplifier utilizing the device of Figure 9.
Figure 11 is a view in perspective illustrating schematically a semi-conductor device comprising a plurality of pairs of small-area electrodes in accordance with the present invention.

Figure 4 illustrates by way of example a practical form of the line-contact semi-conductor device of the present invention. Semi-conductor body 12 may consist of a block of germanium crystal secured by soldering or in any other suitable manner to stud 25 which may, for example, consist of brass. Stud 25 accordingly represents the large-area or base electrode of the device. Brass stud 25 and crystal 12 are yieldingly mounted in brass cup 26 which may be secured by set screw 27 in upright 28 secured to or integral with base plate 30. Base plate 30 and upright 28 consist of an insulating material such as a molded plastic of the Bakelite type.

Between brass stud 25 and brass cup 26 there is provided cup 31 of a yielding material such, for example, as rubber. Rubber cup 31 may consist of disc 32 and hollow cylinder 33 to facilitate assembly of the parts. When the parts are assembled as shown in Figure 4, crystal 12 is yieldingly mounted in upright 28 by rubber cup 31 and its outer face may adjust itself to provide an intimate contact with electrodes 14 and 15 which are provided on insulating member 35. Member 35 may consist, for example, of lava ceramic and consists of a solid cylinder with a reduced front portion as illustrated. Member 35 has the purpose of supporting the two thin wires which form electrodes 14, 15 because it is more convenient to secure the wires to a separate insulating member rather than to stretch them across the face of crystal 12.

Wires 14, 15 are, at present, stretched across the face of member 35 by hand with the aid of a magnifying glass or microscope. It is also feasible to provide the face of member 35 with two parallel shallow grooves to facilitate positioning of the wires. The thin wires which form electrodes 14, 15 are then welded or otherwise connected to two heavy wires 36 and 37 which extend through member 35 and may serve as terminals of the device. Insulating member 35 is slidably mounted in a suitable opening of upright member 38 which is also secured to base plate 30.

Lead screw 40 having a knurled head 41 is threaded through upright 43 secured to base plate 30. A lock nut 42 locks lead screw 40 against further rotation. Lead screw 40 has a smooth end portion 44 which is adapted to cooperate with member 35. Wire 45 is soldered or welded to brass stud 25 and extends through brass cup 26 so that contact can be made with the base electrode.

When the device of Figure 4 is assembled in the manner shown, the semi-conductor device is ready for operation. By means of lead screw 40, member 35 carrying wires 14, 15 is advanced toward the face of crystal 12. The pressure between wires 14 and 15 and crystal 12 is increased until the electric resistance between one of the wires 14 or 15 and crystal 12 or its base electrode 25 does not appreciably vary with an increase of pressure. Then lead screw 40 is locked by nut 42. When the pressure is first increased, the resistance between one of the wires 14 or 15 and crystal 12 decreases because the number of individual contact points increases until the resistance finally reaches a lower saturation level indicating intimate contact between the wires and the crystal face.

Figures 5 and 6 illustrate a preferred embodiment of the line-contact semi-conductor device of the present invention. Figure 5 shows a glass plate 50 mounted on stud 51 which may consist of a molded plastic or other suitable insulator. Wires 14 and 15 are stretched across glass plate 50 in the manner previously explained and are secured to heavy nickel wires 52 and 53 respectively extending through stud 51 as illustrated. Wires 14, 15 may be held in position on glass plate 50 by a thin layer of varnish which, however, should not cover the exposed outer surfaces of the wires.

Crystal 12 (Figure 6) is soldered to copper foil 55 which encloses rubber pad 56 or another suitable yielding material. Accordingly, copper foil 55 represents the base electrode. Rubber pad 56 with its copper foil 55 is pushed into stainless steel cap 57 as illustrated. Thereafter, the assembly of Figure 5 is pushed into cap 57 until the pressure between wires 14, 15 and crystal 12 is sufficiently large. Then tab 58 on steel cap 57 is bent over to hold the assembled parts under the proper tension. Contact to the base electrode or copper foil 55 is made through cap 57, tab 58 and a heavy nickel wire 60 soldered or welded to tap 58. The unit of Figure 6 is now ready for use.

Figure 7 illustrates schematically a modified form of the semi-conductor device of the invention. Three wires 62, 63, 64 are provided in the manner previously explained on the flat face of crystal 12 which is provided with base electrode 13. Wire 62 may be used as the emitter electrode while wires 63, 64 may be used as individual collector electrodes to which separate circuits are connected as shown, by way of example, in Figure 8.

For lack of a better symbol electrodes 62, 63 and 64 have been shown as arrows on the semi-conductor body 12 of Figure 8 but it will be understood that electrodes 62, 63 and 64 preferably are not point-contact but line-contact electrodes. In the circuit of Figure 8 base electrode 13 is grounded while an input signal may be impressed through input terminals 65 and coupling capacitor 66 on emitter electrode 62. Emitter electrode 62 is biased in a relatively conducting polarity by a suitable source of voltage such as battery 67 connected to emitter electrode 62 through resistor 68. Collector electrodes 63 and 64 are biased in a relatively non-conducting polarity through a suitable source of voltage such as battery 70 connected through resistors 71 and 72 respectively to collector electrodes 63 and 64. Separate output signals may be obtained from output terminals 73 and 74 connected through coupling capacitors 75 and 76 respectively to collector electrodes 63 and 64. The circuit of Figure 8 may accordingly be used as twin amplifier having a single pair of input terminals 65 and two pairs of output terminals 73 and 74.

The circuit of Figure 8 otherwise functions in a conventional manner so that a more detailed description thereof is not deemed to be necessary. It should be pointed out, however, that the arrangement of Figures 7 and 8 is particularly efficient because substantially all charge carriers or holes emitted by emitter electrode 62 are collected by collector electrodes 63 and 64.

Figure 9 illustrates another semi-conductor device in accordance with the present invention comprising wires 80, 81 and 82 provided on the flat face of semi-conductor body 12 which has a base electrode 13. As shown in the circuit of Figure 10, wire 80 may be arranged as a collector electrode while wires 81 and 82 may serve as emitter electrodes.

The circuit of Figure 10 is a mixer circuit or it may be used as a class B or C amplifier having a push-pull input circuit and a single-ended or unbalanced output circuit. The circuit of Figure 10 is arranged as a mixer amplifier and comprises input terminals 83 and 84 connected through coupling capacitors 85 and 86 to emitter electrodes 81 and 82. By means of batter 87 which is connected through resistors 88 and 89 respectively to the emitter electrodes 81 and 82 the latter may be biased in a relatively conducting polarity in accordance with conventional practice. Battery 91 is connected through resistor 92 to collector electrode 80 to bias it in a relatively non-conducting polarity. The output signal may be derived from output terminals 93 connected to collector electrode 80 through coupling capacitor 94. Base electrode 13 may be grounded as shown.

Two signals impressed on input terminals 83 and 84 are mixed by the circuit of Figure 10, and the amplified and mixed output signal may be derived from output terminal 93. The operation of the circuit of Figure 10 will be evident from the above explanations.

Figure 11 illustrates still another embodiment of the semi-conductor device of the invention. Semi-conductor body 12 is provided with base electrode 13 and with a plurality of wires 95 between which is arranged another plurality of wires 96, thereby to form a number of pairs of wires 95, 96. By means of lead 97 wires 95 may be connected together while lead 98 interconnects wires 96. One set of wires such as wires 95 may be made emitter electrode, while the other set of wires 96 may serve as collector electrodes.

The device of Figure 11 will permit still higher power outputs and a higher amplification factor. This is due to the fact that each emitter electrode (except one) is surrounded by two collector electrodes while each collector electrode (except one) is surrounded by two emitter electrodes. Accordingly, substantially all charge carriers emitted by the emitter electrodes are collected by the collector electrodes, and the power handling capacity of the device is increased in view of the larger number of electrodes.

There has thus been disclosed a novel multi-electrode semi-conductor device which may be used as an amplifier, oscillator or the like. The new device has lower input and output impedances than previously known devices and also provides for a larger amplification factor and a higher power output. The device is provided with two or more line-contact electrodes which are arranged substantially parallel to each other thereby to improve the field distribution and to equalize the paths of the charge carriers between the emitter and collector electrodes.

What is claimed is:

1. A semi-conductor device comprising a body of semi-conducting material having a substantially flat face, a first electrode having a relatively large contact area with said body, at least four further electrodes consisting each of a metallic wire, each consisting of a wire-like metallic conductor, means for connecting alternate conductors together, and means for pressing said conductors substantially parallel to each other and relatively closely from each other against said flat face to provide substantially a line contact between each of said conductors and said face, the area of said line contacts being small compared to the contact area of said first electrode.

2. A semi-conductor device comprising a body of semi-conducting material having a substantially flat face, a first electrode having a relatively large contact area with said body, at least two pairs of further electrodes, each consisting of a metallic filamentary conductor, means for pressing said conductors substantially parallel to each other in relatively close proximity and equally spaced against said flat face to provide substantially a line contact between each of said conductors and said face, and connections for connecting alternate conductors of each pair of electrodes together, the area of said line contacts being small compared to the contact area of said first electrode.

3. A semi-conductor device comprising a body of semi-conducting material having a substantially flat face, a stationary support, means for resiliently securing said body to said support, an insulating member having a substantially flat face, two substantially parallel wire-like conductor elements spaced relatively closely from each other and provided on the face of said member, and means for pressing the face of said member against the face of said body to provide lines of contact between said conductor elements and the face of said body.

4. A semi-conductor device comprising a body of semi-conducting material having a substantially flat face, a stationary support, means for resiliently securing said body to said support, an insulating member having a substantially flat face, two substantially parallel filamentary conductors spaced relatively closely from each other and provided on the face of said member, and means for advancing the face of said member against the face of said body to press said conductors against said body to provide an intimate contact substantially over the entire lines of contact between said conductors and the face of said body.

5. A semi-conductor device comprising a body of semiconducting material having a substantially flat face, a stationary support, means for resiliently biasing said body in said support, an insulating member having a substantially flat face, two substantially parallel metallic wires spaced relatively closely from each other and provided on the face of said member, and means for advancing said member against said body to press said wires against the face of said body and to permit said body to move to such a position as to provide an intimate contact substantially over the entire line of contact between each of said wires and the face of said body.

6. In a translating device, a semi-conductive translating element with a base electrode attached thereto; and an emitter and a collector element each comprising a plurality of adjacent line contacts parallel and spaced apart one from the other engaging said semi-conductive translating element, the position of said line contacts with relation to one another being such that every other one is a line contact of said emitter element and therebetween every other one is a line contact of said collector element.

7. In a translating device, a semi-conductive translating element with a base electrode attached thereto; and an emitter and a collector element each comprising a plurality of line contacts engaging said semi-conductive translating element, said line contacts being every other one a line contact of said emitter element and therebetween every other one a line contact of said collector element.

8. A semi-conductor device comprising a body of semiconducting material having a substantially flat face, a first electrode having a relatively large contact area with said body, at least four further electrodes consisting each of a metallic wire, means for connecting alternate conductors together, and means for pressing said conductors substantially parallel to each other and relatively closely from each other against said flat face to provide substantially a line contact between each of said conductors and said face, the area of said line contacts being small compared to the contact area of said first electrode.

9. A multiple output channel amplifier including multiple output channels, a translator having a body of N-type germanium, a non-rectifying contact in engagement with the germanium and plural rectifier contact electrodes engaging said germanium in mutually close proximity, one of said rectifier contact electrodes being connected to said signal source and the remaining rectifier contact electrodes being separated from said one rectifier contact electrode by spacing of the order of 0.001–0.003 inch and being severally connected to said output channels, said input rectifier contact electrode having a positive biasing means and said output rectifier contact electrodes having negative biasing means.

10. An amplifier including a signal source, multiple output channels, a translator having a body of semiconductor material, a non-rectifying contact in engagement with the semi-conductor body and plural rectifier contact electrodes engaging said body in mutually close proximity, one of said rectifier contact electrodes being connected to said signal source and the remaining rectifier contact electrodes being separated from said one rectifier contact electrode by spacing of the order of 0.001–0.003 inch and being severally connected to said output channels, said input rectifier contact electrode having means for biasing it in the forward direction with respect to said body and said output rectifier contact electrodes having means for biasing them in the reverse direction with respect to said body.

11. An amplifier including a signal source, multiple output channels each of which includes a load impedance, and a semiconductor translator including a body of semiconductor, an area contact engaging said body, and a plurality of rectifying electrodes engaging said body, one of said electrodes being connected to said signal source and the remainder of said electrodes being spaced from said one electrode equally and being connected respectively to said load impedances, said remainder of said electrodes being sufficiently close to said one electrode to produce interaction of the type produced in a germanium body between an input point contact and an output point contact spaced from the input point contact by .001–.003 inch, said signal source and said one electrode connected thereto having a direct current supply connected thereto and to said area contact, and said load impedances and said remainder of said electrodes each having a direct current supply connected thereto and to said area contact, the polarity of energization of said one electrode being opposite in relation to said area contact to that of said remainder of said electrodes.

References Cited in the file of this patent

UNITED STATES PATENTS

| | | |
|---|---|---|
| 1,900,018 | Lillienfeld | Mar. 7, 1933 |
| 2,476,323 | Rack | July 19, 1949 |
| 2,524,035 | Bardeen et al. | Oct. 3, 1950 |

FOREIGN PATENTS

| | | |
|---|---|---|
| 233,782 | Great Britain | May 14, 1925 |
| 241,766 | Switzerland | Aug. 16, 1946 |
| 599,341 | Great Britain | Mar. 10, 1948 |